(12) United States Patent
Kramer

(10) Patent No.: US 7,862,316 B2
(45) Date of Patent: Jan. 4, 2011

(54) FOAMED MECHANICAL PLANARIZATION PADS MADE WITH SUPERCRITICAL FLUID

(75) Inventor: Stephen J. Kramer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 224 days.

(21) Appl. No.: 11/650,047

(22) Filed: Jan. 4, 2007

(65) Prior Publication Data

US 2007/0122511 A1 May 31, 2007

Related U.S. Application Data

(62) Division of application No. 10/180,408, filed on Jun. 24, 2002, now Pat. No. 7,166,247.

(51) Int. Cl.
*B29C 44/36* (2006.01)
(52) U.S. Cl. .................. 425/4 R; 425/817 R; 425/144; 425/149; 264/51; 264/52
(58) Field of Classification Search ............... 425/4 R, 425/817 R, 144, 149; 264/51, 52
See application file for complete search history.

(56) References Cited

U.S. PATENT DOCUMENTS

| | | | |
|---|---|---|---|
| 4,737,526 A | 4/1988 | Mukaiyama et al. | |
| 4,927,432 A | 5/1990 | Budinger et al. | |
| 5,158,986 A | 10/1992 | Cha et al. | |
| 5,334,356 A * | 8/1994 | Baldwin et al. | 422/133 |
| 5,358,675 A * | 10/1994 | Campbell et al. | 264/50 |
| 5,584,146 A | 12/1996 | Shamouillan et al. | |
| 5,866,053 A | 2/1999 | Park et al. | |
| 5,957,757 A | 9/1999 | Berman | |
| 6,126,532 A | 10/2000 | Sevilla et al. | |
| 6,169,122 B1 | 1/2001 | Blizard et al. | |
| 6,217,426 B1 | 4/2001 | Tolles et al. | |
| 6,231,942 B1 | 5/2001 | Blizard et al. | |
| 6,235,380 B1 | 5/2001 | Tupil et al. | |
| 6,248,810 B1 | 6/2001 | St. Clair et al. | |
| 6,284,810 B1 | 9/2001 | Burnham et al. | |
| 6,293,852 B1 | 9/2001 | Roberts et al. | |
| 6,294,115 B1 | 9/2001 | Blizard et al. | |
| 6,306,019 B1 | 10/2001 | Finkelman | |
| 6,322,347 B1 | 11/2001 | Xu | |
| 6,325,703 B2 | 12/2001 | Cook et al. | |
| 6,818,301 B2 | 11/2004 | Obeng et al. | |

OTHER PUBLICATIONS

Website contents of Trexel, Inc. (http://www.trexel.com) as of Aug. 8, 2002.
D. F. Baldwin et al., "An Extrusion System for the Processing of Microcellular Polymer Sheets: Shaping and Cell Growth Control," Polymer Engineering and Science, May 1996, vol. 36, No. 10, pp. 1425-1435.

* cited by examiner

*Primary Examiner*—Maria Veronica D Ewald
(74) *Attorney, Agent, or Firm*—Wells St. John P.S

(57) ABSTRACT

Foamed thermoplastic polymeric mechanical planarization polishing pads ("MP pads") made with supercritical fluids are presented. A supercritical fluid foaming agent is dissolved in a thermoplastic polymer. A rapid change in the solubility and volume of the supercritical fluid foaming agent in the thermoplastic polymer results in foaming of the thermoplastic polymer. Foamed thermoplastic polymeric MP pads are advantageously both significantly and uniformly porous.

29 Claims, 6 Drawing Sheets

FOAMED MECHANICAL PLANARIZATION PADS MADE WITH SUPERCRITICAL FLUID

CROSS-REFERENCE TO RELATED APPLICATIONS

This is a divisional of commonly-assigned U.S. patent application Ser. No. 10/180,408, filed Jun. 24, 2002, now U.S. Pat. No. 7,166,247, which is hereby incorporated by reference herein in its entirety.

BACKGROUND OF THE INVENTION

This invention relates to uniformly-foamed thermoplastic polymeric mechanical planarization polishing pads ("MP pads"). More particularly, this invention relates to uniformly-foamed thermoplastic polymeric MP pads made with supercritical fluids.

Multiple layers of conducting, semiconducting, dielectric, and insulating materials are deposited on a substrate during integrated circuit device fabrication. Often, imperfect substrate fabrication and imperfect integrated circuit layer deposition result in formation of undesirable topography (e.g., recesses, protrusions, scratches, etc.) on the substrate and on one or more of the deposited layers. Because undesirable topography can compromise the integrity of an integrated circuit device (e.g., a topographical recess in a dielectric layer can impose step coverage problems with the deposition of another integrated circuit layer, undesirable topology can cause depth of focus issues during photolithography, etc.), the substrate and each deposited layer of an integrated circuit device are preferably planarized (i.e., made level) before additional layers of integrated circuit material are deposited.

Known mechanical planarization ("MP") processes are used to remove undesirable topology from layers of integrated circuit material. Generally, an MP pad rotating about a line preferably perpendicular to the surface of an integrated circuit wafer is brought into contact with that surface during an MP process. The rotating MP pad mechanically polishes (i.e., removes undesirable topography from) the surface material of the integrated circuit wafer. Concurrently, a fluid-based chemical (i.e., a chemical polishing "slurry") that reacts with the integrated circuit material (i.e., for a chemical-mechanical planarization ("CMP") process) or an inert liquid applied to the MP pad facilitates the removal of undesirable topography. For example, an inert liquid applied to the interface between an MP pad and an integrated circuit wafer can facilitate the removal of mechanically-ground integrated circuit material.

The porosity of an MP pad is often controlled to positively affect the material removal rate of an MP process. In particular, the porosity level of an MP pad directly influences and can increase the material removal rate, because the "pores" of an MP pad retain and distribute chemical or inert polishing liquid that facilitates the planarization of undesirable topography. However, a significantly porous MP pad may be undesirable unless the MP pad pores are both uniform in size and uniform in distribution throughout the MP pad. Because uniform MP pad pores evenly distribute polishing liquid to the surface of an integrated circuit wafer, a uniformly porous MP pad contributes to a desirable uniform material removal rate across the surface of the integrated circuit wafer. Thus, uniformity in the porosity level of the MP pad (i.e., uniformity in porosity level across the surface and throughout the bulk of a single MP pad and uniformity in porosity level from MP pad to pad) is an important MP pad characteristic.

Various known fabrication methods produce porous MP pads. For example, the known method of including hollow microbeads in a liquid prepolymer imparts porosity in thermoset polymer MP pads (e.g., Rodel IC1000 MP pad). As another example, the known method of coating a porous network of felt or woven fibers with a thermoset polymer also imparts porosity in thermoset polymer MP pads (e.g., Thomas West 711 MP pad). In another known method, perforations (i.e., slurry "cups") or through-holes are cut or molded into a polymer to provide porosity in MP pads. In still another known method, direct foaming of thermoset polymers using a non-supercritical fluid foaming agent produces porous thermoset polymer MP pads (e.g., Universal Photonics ESM-U MP pad).

Thermoset polymer MP pads may be, however, problematic. In particular, because thermoset polymers are generally formed in thick "cakes" that are characteristically non-uniform over the surface and throughout the bulk of the cake (which is caused by a non-uniform temperature of the cake during curing of the thermoset polymer), individual thermoset polymer MP pads mechanically skived (i.e., cut) from a thermoset cake are likely to exhibit unpredictable irregularities and non-uniformity. Further, mechanically skiving a thermoset cake can introduce surface and bulk irregularities such as, for example, fracturing and abrasions in thermoset MP pads. Thus, thermoset polymer MP pads are often characterized by undesirable non-uniformity across the surface and throughout the bulk of a single MP pad and by undesirable non-uniformity from MP pad to pad.

Because non-uniform MP pads can produce undesirable non-uniformity in the surface of an integrated circuit wafer during polish of that wafer, it may not be desirable to use caked thermoset polymer MP pads in an MP process. In addition, because mechanically cutting thermoset cakes to produce thermoset MP pads typically results in significant material waste (i.e., the unusable material cut from the edges of thermoset cakes), methods of fabricating thermoset MP pads from caked thermoset polymers may not be cost-effective. Note that although single thermoset polymer MP pads may be formed via reaction injection molding ("RIM"), difficulty in controlling the ratio of components of the thermoset polymer during injection and in controlling the temperature of the thermoset polymer during thermoset polymer curing causes these pads to be especially non-uniform.

In contrast to thermoset polymers that are generally formed in thick cakes, thermoplastic polymers are generally formed (e.g., molded or extruded) in single sheets or units at a time. Thus, thermoplastic polymeric MP pads can be advantageously individually fabricated and generally do not require mechanical skiving that can cause MP pad defects and material waste.

For example, Cook et al. U.S. Pat. No. 6,325,703 describes a method of fabricating porous thermoplastic polyurethane MP pads by sintering. In particular, dry thermoplastic polyurethane resins are placed in an individual MP mold and "welded" together via a heating cycle (at temperatures below the melting point) to produce a porous thermoplastic polyurethane MP pad. However, sintered thermoplastic polymeric MP pads may be problematic. In particular, because dry thermoplastic resins are often imperfectly mechanically ground to a predetermined size before they are sintered, and because slight variations in resin size can result in undesirably non-uniform pores, sintered thermoplastic polymeric MP pads can be undesirably non-uniformly porous. Further, uneven pressure and uneven distribution of dry thermoplastic resins in an MP pad mold can result in sintered thermoplastic polymeric MP pads that are non-uniformly porous.

As another example, Budinger et al. U.S. Pat. No. 4,927,432 describes a method of coalescing a solubilized thermoplastic polymer with a porous network of felt or woven fiber to impart porosity in thermoplastic polymer pads. However, because the thermoplastic pad derives its porosity from the projecting ends of the porous network, and because these projecting ends are somewhat randomly distributed, thermoplastic MP pads made by coalescing thermoplastic polymer with felt or woven fiber are often non-uniformly porous.

Other products (e.g., polystyrene packaging, high density polyethylene bottles, etc.) use known fabrication methods to produce porous thermoplastic polymeric materials that are both significantly porous and uniform in porosity. In particular, known fabrication methods using supercritical fluids produce foamed thermoplastic polymeric materials (which are characteristically porous) that are both significantly porous and uniform in porosity. For example, methods of fabricating foamed thermoplastic polymeric materials using supercritical fluids are described in Cha et al. U.S. Pat. No. 5,158,986, Park et al. U.S. Pat. No. 5,866,053, Blizard et al. U.S. Pat. No. 6,231,942, Park et al U.S. Pat. No. 6,051,174, and Blizard et al. U.S. Pat. No. 6,169,122. In the known methods, a rapid change in the solubility and volume of a supercritical fluid dissolved in a thermoplastic polymer results in foaming of the thermoplastic polymer. Moreover, because thermoplastic polymeric scrap material can be reprocessed, these known methods of fabricating foamed thermoplastic polymers using supercritical fluids can eliminate process waste of thermoplastic polymeric material. However, such methods are not known for fabricating MP pads.

In view of the foregoing, it would be desirable to use known methods of fabricating foamed thermoplastic polymeric materials using supercritical fluids to fabricate foamed thermoplastic polymeric MP pads.

SUMMARY OF THE INVENTION

It is an object of this invention to use known methods of fabricating foamed thermoplastic polymeric materials using supercritical fluids to fabricate foamed thermoplastic polymeric MP pads.

In accordance with the invention, known methods are used to make foamed thermoplastic polymeric MP pads that are both significantly porous and uniform in porosity. In these methods according to the invention, a supercritical fluid foaming agent is dissolved in a thermoplastic polymer. A rapid decrease in solubility of the supercritical fluid foaming agent in the thermoplastic polymer and a rapid increase in volume of the supercritical fluid foaming agent in the thermoplastic polymer result in foaming of the thermoplastic polymer. In some embodiments, one or more pressure drops cause the rapid changes in solubility and in volume of the supercritical fluid foaming agent. In other embodiments, one or more temperature increases cause the rapid changes in solubility and volume of the supercritical fluid foaming agent. In still other embodiments, one or more pressure drops and one or more temperature increases cause the rapid changes in solubility and volume of the supercritical fluid foaming agent in the thermoplastic polymer. The rate of pressure drop and the rate of temperature increase are directly proportional to cell density in a foamed thermoplastic polymer. Produced thermoplastic polymeric MP polishing pads can be open-celled or closed-celled in accordance with the invention.

In one method of fabricating foamed thermoplastic polymeric MP polishing pads in accordance with the invention, a foamed thermoplastic polymeric MP polishing pad is produced by foaming a solid thermoplastic polymer impregnated with a supercritical fluid foaming agent. In one embodiment of this method, the solid thermoplastic polymer is molded in an MP pad mold before it is foamed. In other embodiments, the solid thermoplastic polymer is formed into a sheet from which individual MP pads are mechanically skived (either before or after the solid thermoplastic polymer is foamed).

In another method of fabricating foamed thermoplastic polymeric MP polishing pads in accordance with the invention, a foamed thermoplastic polymeric MP pad is produced by foaming a single-phase solution of a thermoplastic polymer and supercritical fluid foaming agent. In one embodiment of this method, the foamed thermoplastic polymer is molded in an MP pad mold. In other embodiments, the foamed thermoplastic polymer is formed into a sheet from which individual MP pads are mechanically skived. Percent weight by composition of the supercritical fluid foaming agent in the single-phase solution is directly proportional to cell density in the foamed thermoplastic polymer.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention uses known methods of fabricating foamed thermoplastic polymeric materials using supercritical fluids to fabricate thermoplastic polymeric mechanical planarization ("MP") polishing pads.

Figure 1:
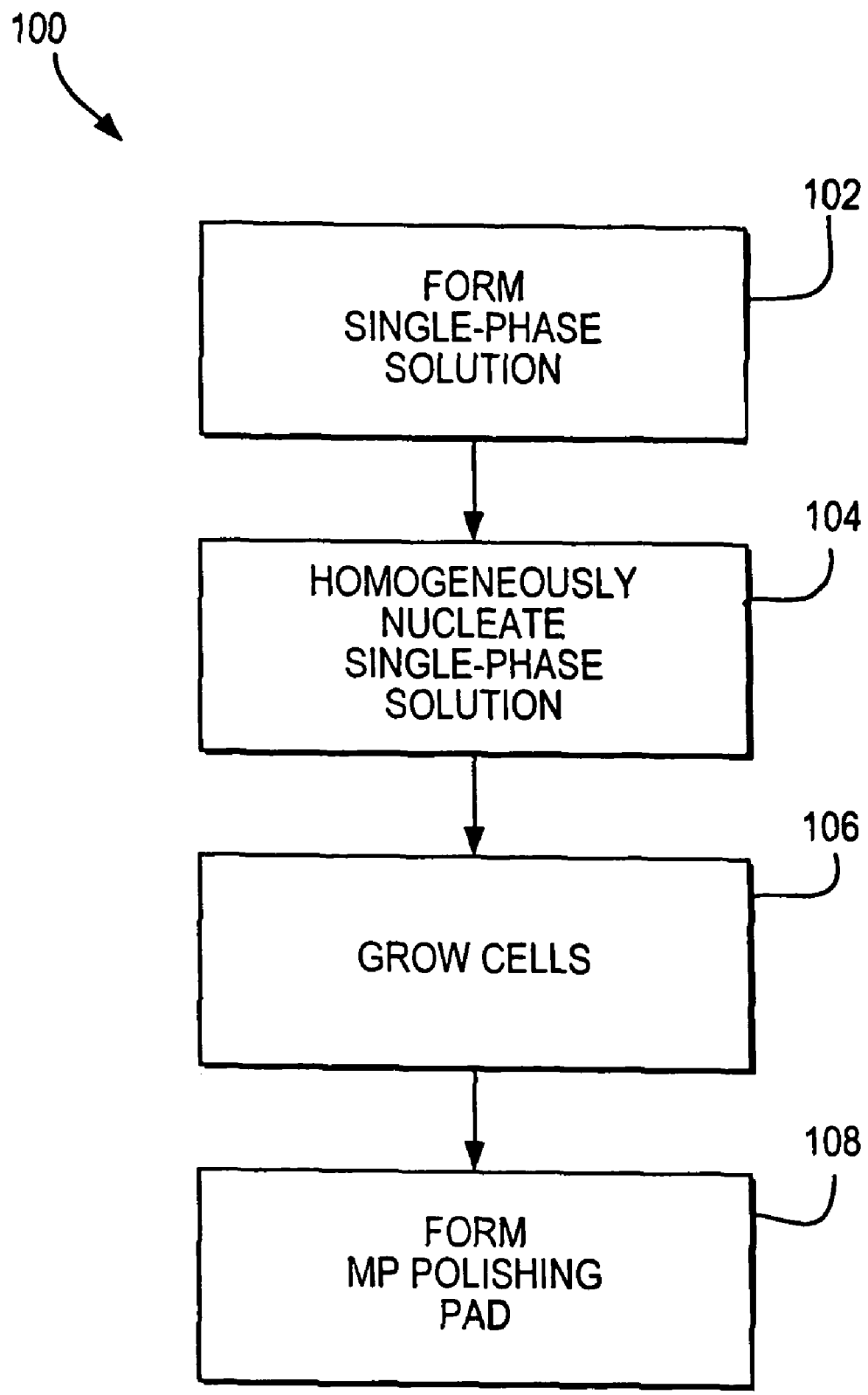
FIG. 1 is a flowchart of an exemplary method of fabricating foamed thermoplastic polymeric MP pads using supercritical fluid according to the invention.

FIG. 1 shows an exemplary method 100 for fabricating foamed thermoplastic polymeric MP pads using supercritical fluid in accordance with the invention. At step 102, a single-phase solution consisting essentially of a molten thermoplastic polymer and a supercritical fluid foaming agent is formed. A supercritical fluid is a material that is concurrently maintained at temperatures and pressures exceeding the critical temperature ($T_c$) and critical pressure ($P_c$) of the material. The supercritical fluid foaming agent is preferably supercritical carbon dioxide ($T_c$=31.1° C., $P_c$=1071.3 psi) or supercritical nitrogen ($T_c$=−147.0° C., $P_c$=492.3 psi), but may be any other supercritical fluid that is gaseous under obtainable MP pad processing conditions and that readily dissolves in a thermoplastic polymer. The thermoplastic polymer may be, for example, any thermoplastic elastomer ("TPE") (e.g., thermoplastic polyurethane ("TPU")), thermoplastic butadiene styrene, thermoplastic polyvinylidene difluorine ("PVDF"), high-impact polystyrene ("HIPS"), any other suitable thermoplastic polymer, or any combination of suitable thermoplastic polymers (i.e., polymer blends or copolymers). Because the percent composition by weight of a supercritical fluid foaming agent in a single-phase solution of a thermoplastic polymer and supercritical fluid foaming agent is generally directly proportional to the cell density in a foamed thermoplastic polymer that results from the single-phase solution, and because it may be desirable to predetermine the cell density in a foamed thermoplastic polymeric MP pad, a stream of supercritical fluid foaming agent and a stream of molten thermoplastic polymer are preferably admixed in a predetermined ratio (e.g., less than about 15% composition by weight of the supercritical fluid foaming agent in the single-phase solution of the molten thermoplastic polymer and supercritical fluid foaming agent) in the formation of a single-phase solution at step 102. Note that in some embodiments, materials such as plasticizers, fillers, and woven and non-woven fabrics may be added to the single-phase solution of step 102 to provide further advantageous characteristics in produced MP pads (e.g., adding plasticisers to soften produced pads, adding fillers to stiffen produced pads, using fabrics to further strengthen and/or impart porosity in produced pads, etc.).

Figure 2:
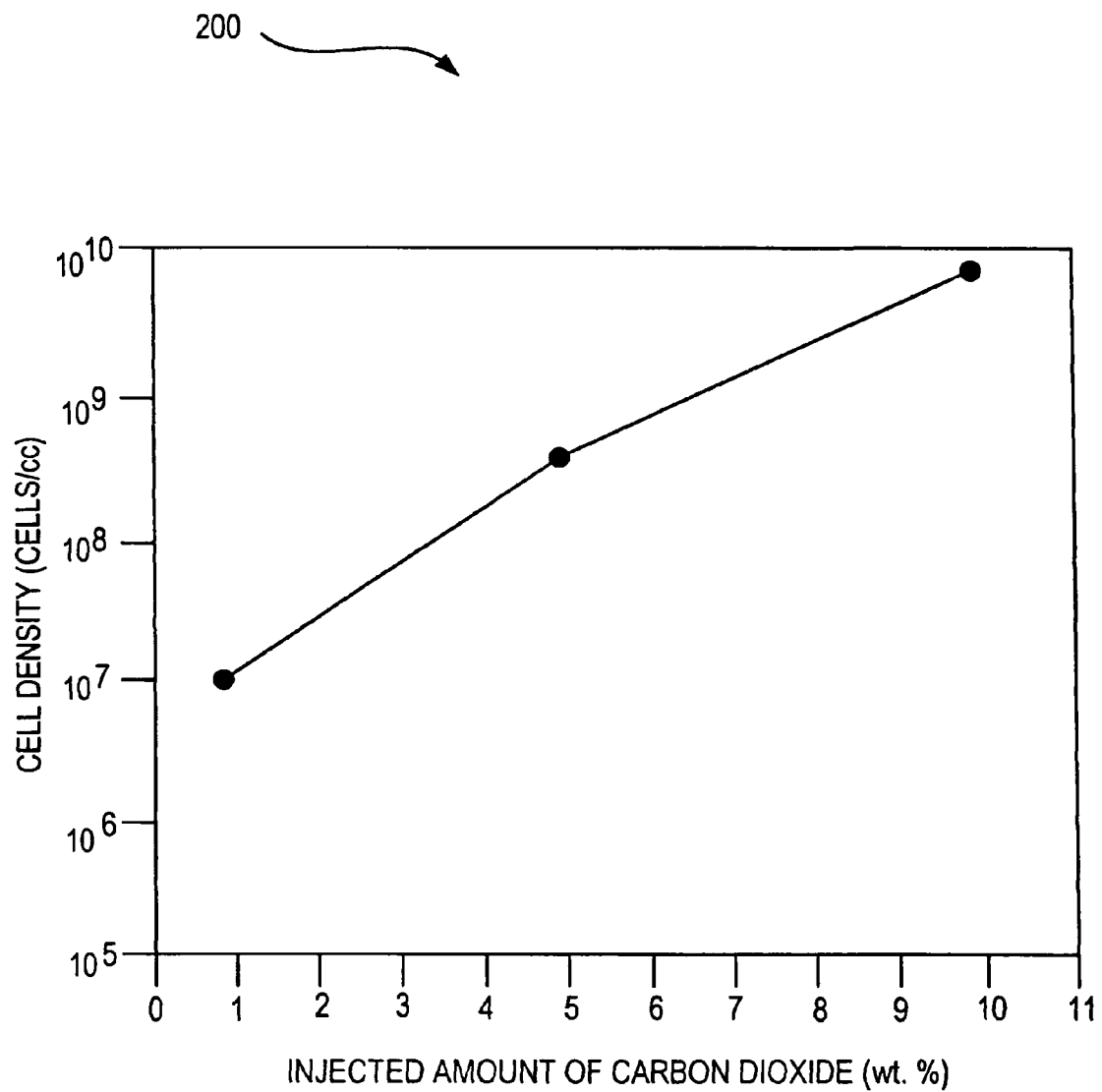
FIG. 2 is a graph of cell densities for an exemplary foamed thermoplastic polymer versus percent composition by weight of an exemplary supercritical fluid foaming agent in a single-phase solution of the corresponding thermoplastic polymer and supercritical fluid foaming agent.

FIG. 2 shows cell densities for an exemplary foamed thermoplastic polymer versus percent composition by weight of an exemplary supercritical fluid foaming agent in a single-phase solution of the corresponding thermoplastic polymer and supercritical fluid foaming agent. In particular, FIG. 2 is a graph of cell densities for foamed high-impact polystyrene ("HIPS") versus percent composition by weight of a supercritical fluid carbon dioxide foaming agent in a single-phase solution of high-impact polystyrene and that foaming agent. As shown, the cell density of the foamed HIPS is directly proportional to the percent composition by weight of the carbon dioxide foaming agent in that single-phase solution. Similar proportionalities are obtained with other suitable thermoplastic polymers and thermoplastic polymer-soluble supercritical fluid foaming agents (e.g., supercritical fluid nitrogen).

Figure 3:
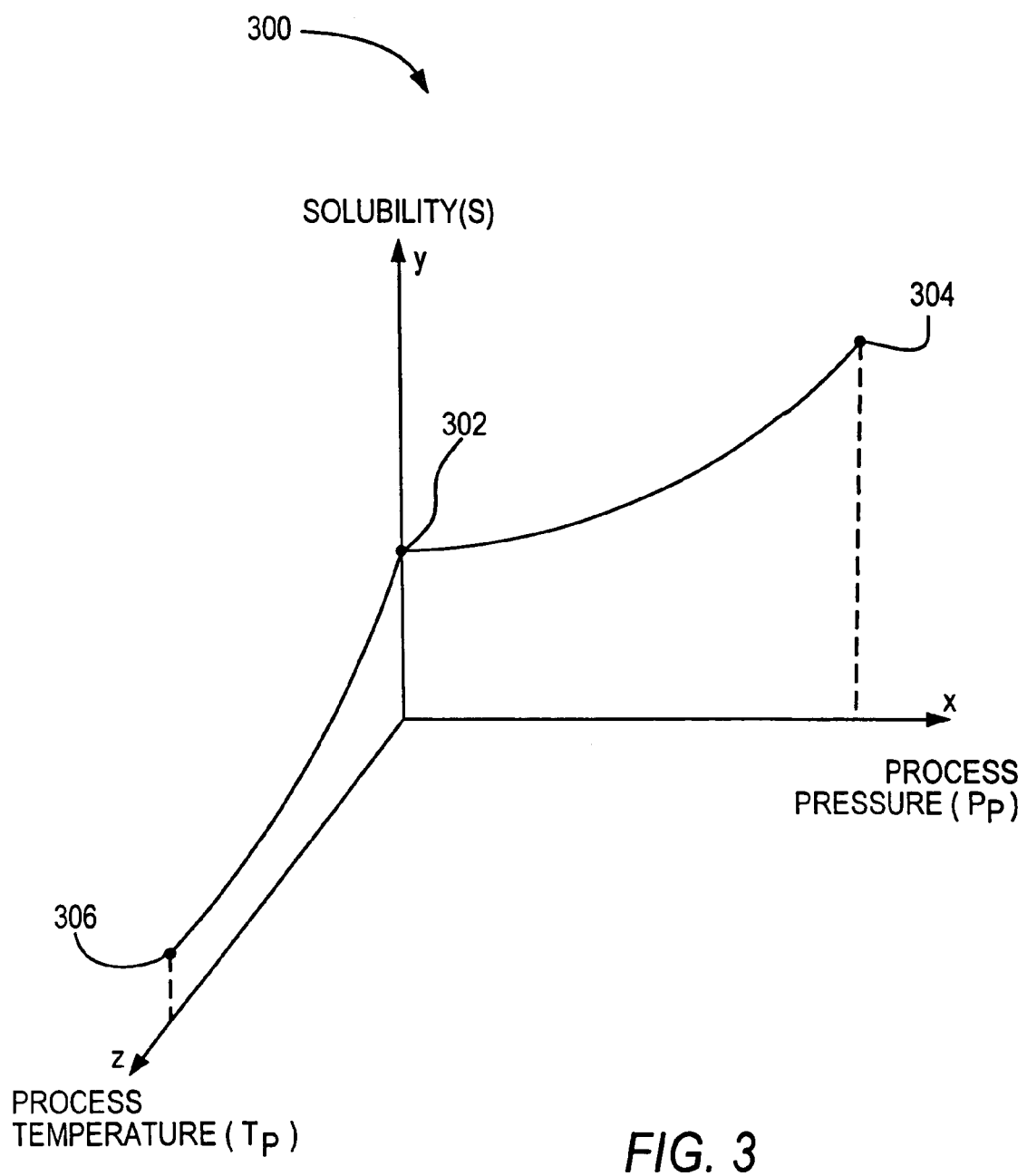
FIG. 3 is a three-dimensional graph of the solubility of a supercritical fluid foaming agent in a thermoplastic polymer versus process temperature and versus process pressure.

The single-phase solution formed at step 102 is characteristically thermodynamically unstable. Particularly, the solubility (S) of the supercritical fluid foaming agent in the thermoplastic polymer is significantly dependent on process temperature ($T_p$) and process pressure ($P_p$) FIG. 3 shows the solubility (y axis) of a supercritical fluid foaming agent in a thermoplastic polymer versus process temperature (z axis) and process pressure (x axis). As shown, the solubility of a supercritical fluid foaming agent in a thermoplastic polymer is inversely proportional to process temperature (i.e., $S \propto 1/T_p$) and directly proportional to process pressure (i.e., $S \propto P_p$). At initial process temperature and pressure 302, an increase in pressure to pressure 304 (while $T_p$ is fixed) increases solubility of the supercritical fluid foaming agent in the thermoplastic polymer. In contrast, an increase in temperature from initial process temperature and pressure 302 to temperature 306 (while $P_p$ is fixed) decreases solubility of the supercritical fluid foaming agent in the thermoplastic polymer.

Because a supercritical fluid foaming agent is generally more soluble in a thermoplastic polymer than is a gaseous or liquid foaming agent, process temperature is preferably maintained above the critical temperature of the foaming agent and process pressure is preferably maintained above the critical pressure of the foaming agent (the combination of which places the foaming agent in a supercritical state) during formation of a single-phase solution at step 102. Further, because the solubility of the supercritical fluid foaming agent is inversely proportional to process temperature, and because a molten thermoplastic polymer more readily dissolves a foaming agent than does a solid thermoplastic polymer, process temperature is preferably maintained slightly above the melting point of the thermoplastic polymer during formation of the single-phase solution at step 102. This achieves maximum solubility of the supercritical fluid foaming agent in the thermoplastic polymer.

Returning to FIG. 1, the single-phase solution of the thermoplastic polymer and the supercritical fluid foaming agent is advantageously homogeneously nucleated at step 104. Homogeneous nucleation is a process by which supercritical fluid foaming agent molecules dissolved in the molten thermoplastic polymer assemble into uniformly sized clusters (e.g., generally including at least several molecules of the foaming agent). These clusters are evenly dispersed throughout the molten thermoplastic polymer and define "nucleation sites" from which cells that impart porosity in produced thermoplastic polymeric MP pads grow. Because the homogeneously nucleated thermoplastic polymeric solution contains uniformly sized and evenly dispersed clusters of supercritical fluid foaming agent, and because cells that impart porosity in produced MP pads grow from these clusters, uniformly porous MP pads can be advantageously produced from the homogeneously nucleated solution.

Homogeneous nucleation of the single-phase solution is driven by the thermodynamic instability of the supercritical fluid foaming agent. In particular, homogeneous nucleation of the single-phase solution of the thermoplastic polymer and supercritical fluid foaming agent is induced by rapidly varying, either individually or concurrently, process temperature and process pressure such that the solubility of the supercritical fluid foaming agent in the thermoplastic polymer is decreased (i.e., by increasing temperature, decreasing pressure, or both). For example, a quickly administered temperature increase induces homogeneous nucleation of the single-phase solution. Alternatively or concurrently, a quickly administered pressure drop (e.g., a drop in pressure of no less than about 1000 psi delivered at a rate of no less than about 14,500 psi/sec) also induces homogeneous nucleation of the single-phase solution.

The nucleation site density of a nucleated thermoplastic polymer/supercritical fluid foaming agent material is generally directly proportional to the pressure drop rate and to the temperature increase rate induced in the corresponding single-phase solution of the material (i.e., nucleation site density $\propto -dP/dt$ and $\propto dT/dt$). Because thermoplastic polymeric cells grow from the clusters of supercritical fluid foaming agent that define the nucleation sites, as previously described, cell density in a foamed thermoplastic polymer is directly proportional to the nucleation site density of the corresponding nucleated thermoplastic polymer (i.e., cell density $\propto$ nucleation site density). Therefore, the cell density of a foamed thermoplastic polymer is directly proportional to the pressure drop rate and to the temperature increase rate induced in a single-phase solution of the corresponding thermoplastic polymer and supercritical fluid foaming agent (i.e., cell density $\propto -dP/dt$ and $\propto dT/dt$).

Figure 4:
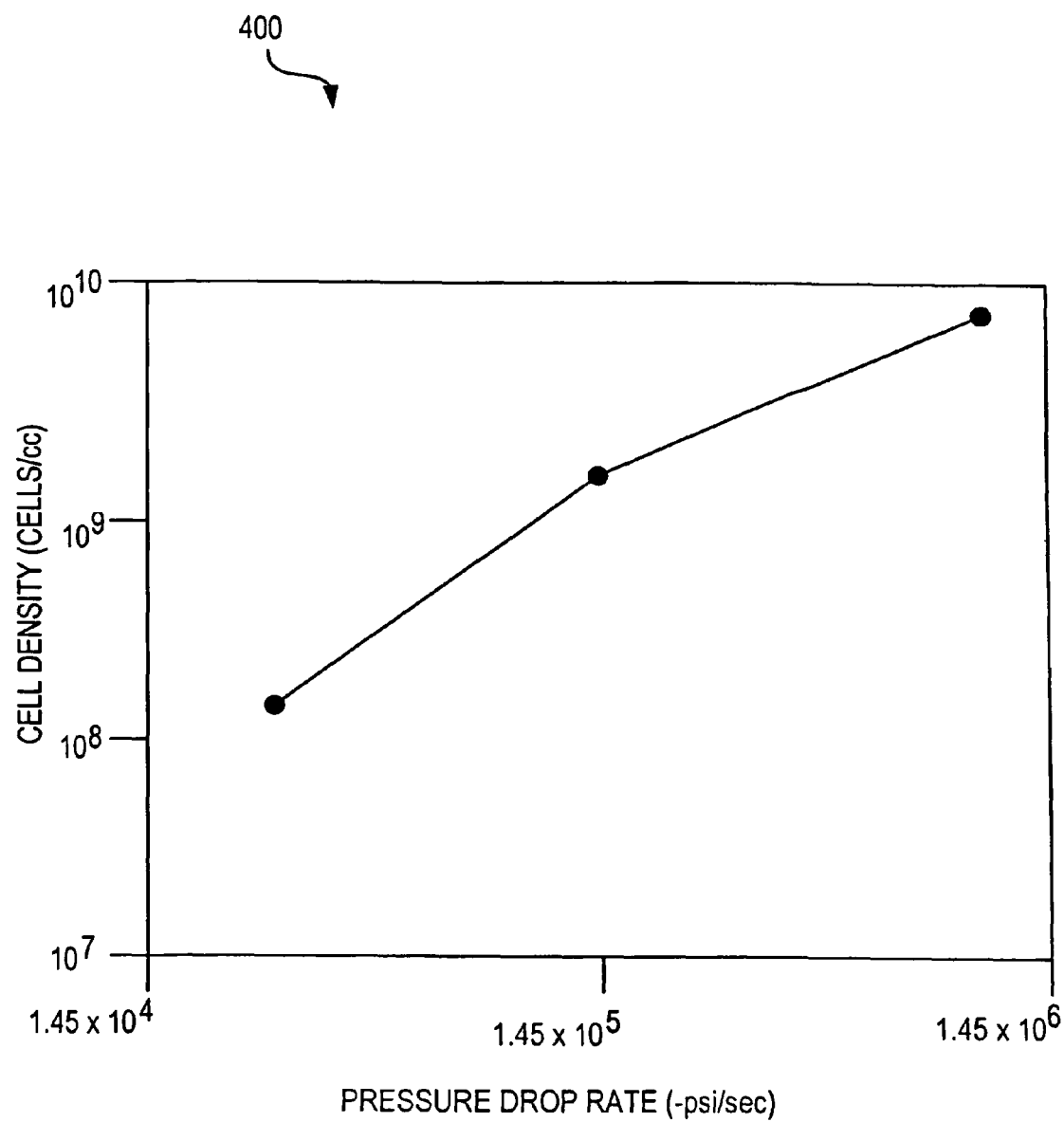
FIG. 4 is a graph of cell densities for an exemplary foamed thermoplastic polymer versus pressure drop rates of a single-phase solution of the corresponding thermoplastic polymer and an exemplary supercritical fluid foaming agent.

For example, FIG. 4 shows cell densities for an exemplary foamed thermoplastic polymer versus pressure drop rates induced in a single-phase solution of the corresponding thermoplastic polymer and an exemplary supercritical fluid foaming agent. In particular, FIG. 4 shows cell densities for foamed high-impact polystyrene ("HIPS") versus pressure drop rates induced in a single-phase solution of high-impact polystyrene and supercritical fluid carbon dioxide foaming agent. The solution is 10% percent composition by weight of the supercritical fluid carbon dioxide. As shown, the cell density of the foamed HIPS is directly proportional to the pressure drop rate induced in the single-phase solution of the HIPS and supercritical fluid carbon dioxide foaming agent. Similar proportionalities are obtained with other suitable thermoplastic polymers and polymer-soluble supercritical fluid foaming agents (e.g., supercritical fluid nitrogen).

Although admixing solid particle "nucleating agents" (e.g., talc, calcium carbonate, titanium oxide, barium sulfate, zinc sulfide, etc.) to a single-phase solution of a thermoplastic polymer and supercritical fluid foaming agent can promote formation of additional nucleation sites in the single-phase solution during nucleation, admixing solid particle nucleating agents to the single-phase solution of step 102 is generally undesirable because solid particle nucleating agents can result in undesirable heterogeneous nucleation of the single-phase solution. Heterogeneous nucleation is the process by which supercritical fluid foaming agent molecules dissolved in the molten thermoplastic polymer assemble into non-uniformly sized clusters that are unevenly dispersed throughout the molten thermoplastic polymer. In particular, because solid particle nucleating agents generally induce a nonuniformity in the nucleation sites in a thermoplastic polymer (i.e., non-uniformity in size and nonuniformity in dispersion) and in the cells grown from the nucleation sites in the thermoplastic polymer, and because CMP pads are preferably uniformly porous, admixing solid particle nucleating agents to the single-phase solution of the thermoplastic polymer and supercritical fluid foaming agent of step 102 is not recommended.

At step 106, cell growth begins at the nucleation sites. A pressure drop or temperature increase (e.g., induced at step 104 or at both steps 104 and 106) results in expansion of the supercritical fluid foaming agent at step 106. In particular, because the volume of the supercritical fluid foaming agent is directly proportional to temperature (i.e., $V \propto T$) and inversely proportional to pressure (i.e., $V \propto 1/P$), a rapid increase in process temperature, or a rapid decrease in process pressure, or both, results in a rapid increase in the volume of the supercritical fluid foaming agent in the thermoplastic polymer. Expanding foaming agent forms-microcellular pores at the nucleation sites in the thermoplastic polymer, thus foaming the thermoplastic polymer. Depending on process conditions (e.g., whether the process pressure exceeds the critical pressure of the supercritical fluid foaming agent and whether the process temperature exceeds the critical temperature of the supercritical fluid foaming agent), the expanding foaming agent can be supercritical or gaseous at step 106.

Process conditions (e.g., process pressure, pressure drop rate, process temperature, and temperature increase rate) determine whether a foamed thermoplastic polymeric MP pad of the invention is open-celled, closed-celled, or a combination of both. Open-celled is a condition in which microcellular pores of a foamed thermoplastic polymer are mutually inclusive (i.e., the pore membrane of a microcellular pore is not intact and infringes on neighboring pore membranes). Foaming agent diffuses out of each open-celled microcellular pore in an open-celled MP pad. Closed-celled is a condition in which microcellular pores of a foamed thermoplastic polymer are mutually exclusive (i.e., the pore membrane of a microcellular pore is intact and does not infringe on neighboring pore membranes). Foaming agent is trapped in the membrane of each closed-celled microcellular pore in a closed-celled MP pad.

In particular, process conditions that significantly exploit the thermodynamic instability of the supercritical fluid (i.e., a large pressure decrease at a quick pressure drop rate, a large temperature increase at a quick temperature increase rate, or both) generally result in the formation of a predominantly open-celled foamed thermoplastic polymer. Less violent process conditions (i.e., a moderate pressure drop at a moderate pressure drop rate, a moderate temperature increase at a moderate temperature increase rate, or both) generally result in the formation of a predominantly closed-celled foamed thermoplastic polymer. Mid-range process conditions generally result in the formation of a foamed thermoplastic polymer that is partially open-celled and partially closed-celled.

In some embodiments (e.g., CMP processes), MP pads are preferably predominantly open-celled because open-celled MP pads can provide an increased transfer of polishing liquid (e.g., a fluid-based chemical) and thus an increased rate of material removal. In some embodiments, MP pads are preferably predominantly closed-celled because closed-celled MP pads can limit the flow of polishing liquid (e.g., inert polishing liquid) to the interface of the MP pad and an integrated circuit wafer and thus carry away mechanically ground integrated circuit material.

At step 108, a foamed thermoplastic polymeric MP pad is formed from the foamed thermoplastic polymer. Preferably, a foamed thermoplastic polymeric MP polishing pad is molded from the foamed thermoplastic polymer. For example, an extruder can extrude a foamed thermoplastic polymer into an MP pad mold at step 108. The foamed thermoplastic polymer in the MP pad mold is then exposed to temperatures and pressures to either promote or prevent continued cell growth in the foamed thermoplastic polymer. In particular, the foamed thermoplastic polymer in the MP pad mold can be exposed to low temperatures and high pressures to prevent continued cell growth or exposed to high temperatures and low pressures to promote continued cell growth in the foamed thermoplastic polymer. Alternatively, the foamed thermoplastic polymer in the CMP pad mold can be exposed to ambient conditions, which will cause cell growth in the foamed thermoplastic polymer to gradually stop.

In other embodiments, the foamed thermoplastic polymer is formed into a sheet at step 108, and individual foamed thermoplastic polymeric MP pads are subsequently mechanically skived from the sheet. However, because mechanical skiving can cause MP pad defects, as previously described, it may be less desirable to form the foamed thermoplastic polymer into a sheet from which individual foamed thermoplastic polymeric MP pads are mechanically skived. Nonetheless, because mechanically-skived thermoplastic polymeric MP pads may be planarized or further finished to reduce pad defects caused by mechanical skiving, and because some molding processes may introduce surface contamination (e.g., caused by mold-release compounds that facilitate the removal of MP pads from an MP mold), the surface of mechanically-skived, planarized MP pads may be, in some instances, more uniform than the surface of molded MP pads.

In another method of fabricating foamed thermoplastic polymeric MP pads in accordance with the invention, a foamed thermoplastic polymeric MP pad is formed in a single step (i.e., steps 104, 106, and 108 performed concurrently) from a single-phase solution of the corresponding thermoplastic polymer and a supercritical fluid. A pressurized single-phase solution of a thermoplastic polymer and a supercritical fluid is extruded into an MP pad mold that is maintained at ambient pressure conditions. A rapid pressure drop nucleates the single-phase solution and causes the foaming agent to expand, thus growing cells in the thermoplastic polymer. In sum, the single-phase solution can be homogeneously nucleated, cells can grow in the thermoplastic polymer, and the MP pad can be formed in the same process step.

Figure 5:
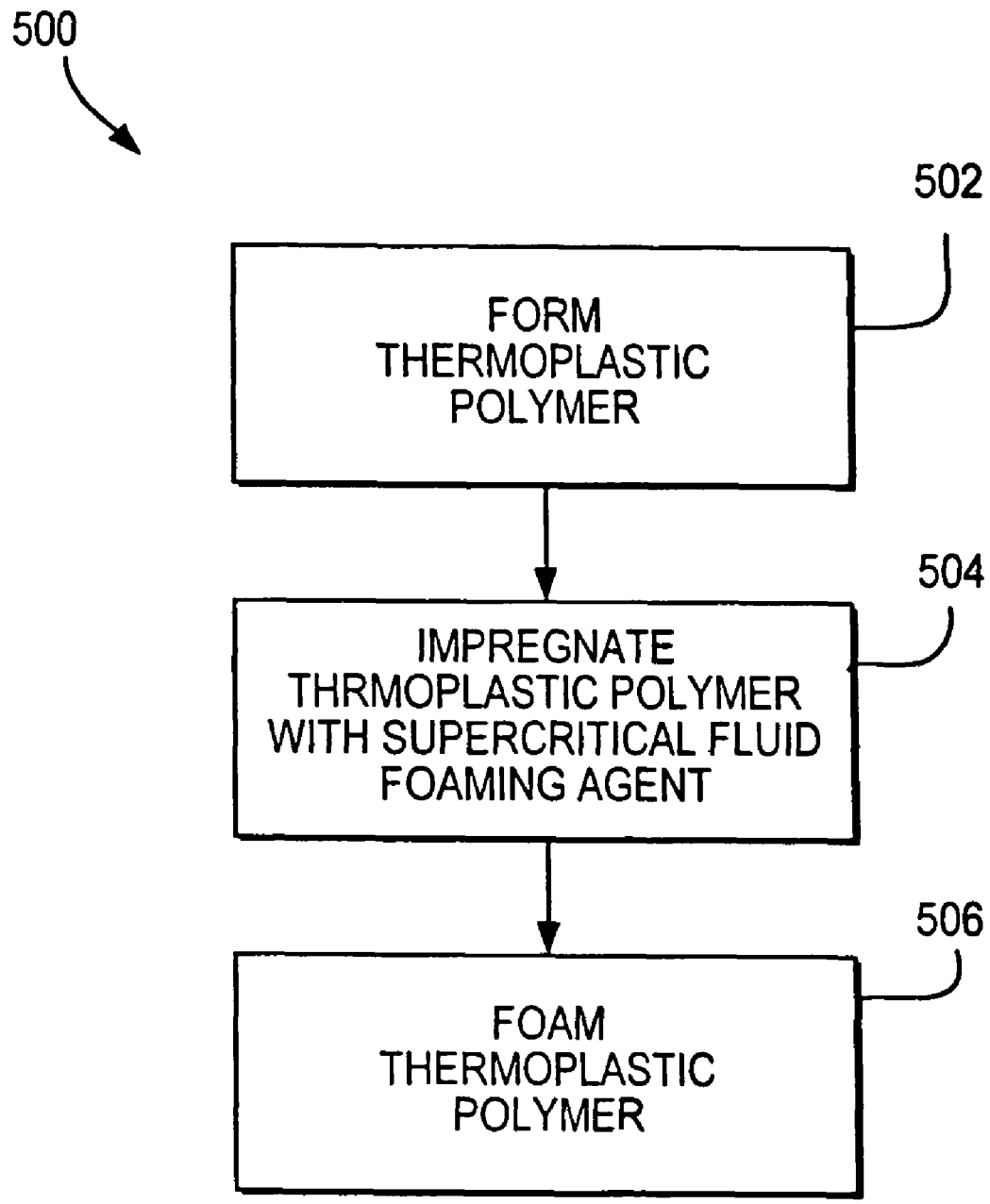
FIG. 5 is a flowchart of another exemplary method of fabricating foamed thermoplastic polymeric MP pads using supercritical fluid according to the invention.

FIG. 5 shows another exemplary method 500 of fabricating foamed thermoplastic polymeric MP pads in accordance with the invention. At step 502, a solid thermoplastic polymer is formed. The thermoplastic polymer may be any of the thermoplastic polymers, polymer blends, or copolymers suitable for use in method 100. Additionally, fillers, plasticisers, and woven and non-woven fabrics may be added during thermoplastic polymer formation at step 502 to provide further advantageous characteristics in produced MP pads. In some embodiments, a thermoplastic polymer is molded in an MP pad mold at step 502. In other embodiments, thermoplastic polymer resins are melted to form a sheet at step 502 from which individual thermoplastic polymer MP pads are subsequently mechanically skived. Mechanical skiving of the thermoplastic polymeric sheet can be performed before or after the sheet of thermoplastic polymer is foamed. As previously described, methods of fabricating foamed MP pads that require mechanical skiving are generally less desirable because mechanical skiving can cause pad defects. However, mechanically-skived MP pads may be planarized or further finished to reduce MP pad defects.

At step 504, the thermoplastic polymer is impregnated with supercritical fluid foaming agent. The supercritical fluid foaming agent may be any of the supercritical fluid foaming agents suitable for use in method 100. Particularly, the supercritical fluid foaming agent is preferably supercritical carbon dioxide or supercritical nitrogen, but can be any other supercritical fluid that is gaseous under ambient conditions and that readily dissolves in a thermoplastic polymer. Because a supercritical fluid foaming agent is generally more soluble in a thermoplastic polymer than is a gaseous or liquid foaming agent, at step 504, process temperature is preferably maintained above the critical temperature of the foaming agent and process pressure is preferably maintained above the critical pressure of the foaming agent (which places the foaming agent in a supercritical state). Also at step 504, the thermoplastic polymer is placed in a pressurized chamber and bathed in a supercritical fluid foaming agent. This causes the thermoplastic polymer to become saturated with the supercritical fluid foaming agent.

At step 506, the thermoplastic polymer is foamed. In particular, the solubility and volume of the supercritical fluid foaming agent in the thermoplastic polymer are rapidly changed to cause nucleation and cell growth in the thermoplastic polymer. Expanding clusters of foaming agent molecules form microcellular pores in the thermoplastic polymer, thus foaming the thermoplastic polymer. In some embodiments, a single, quick pressure drop (e.g., a drop in pressure of no less than about 1000 psi delivered at a rate of no less than about 14,500 psi/sec), or a single, quick increase in temperature, or both, causes a rapid decrease in the solubility and a rapid increase in the volume of the supercritical fluid foaming agent in the thermoplastic polymer. In other embodiments, a first moderate pressure drop or temperature increase (or both) causes a rapid decrease in the solubility of the supercritical fluid foaming agent in the thermoplastic polymer and a second moderate pressure drop or temperature increase (or both) causes a rapid increase in the volume of the supercritical fluid foaming agent in the thermoplastic polymer. As previously described, process conditions (e.g., the level and rate of pressure drop and the level and rate of temperature increase) generally determine whether foamed thermoplastic polymeric MP pads are open-celled, closed-celled, or a combination of both.

Figure 6:
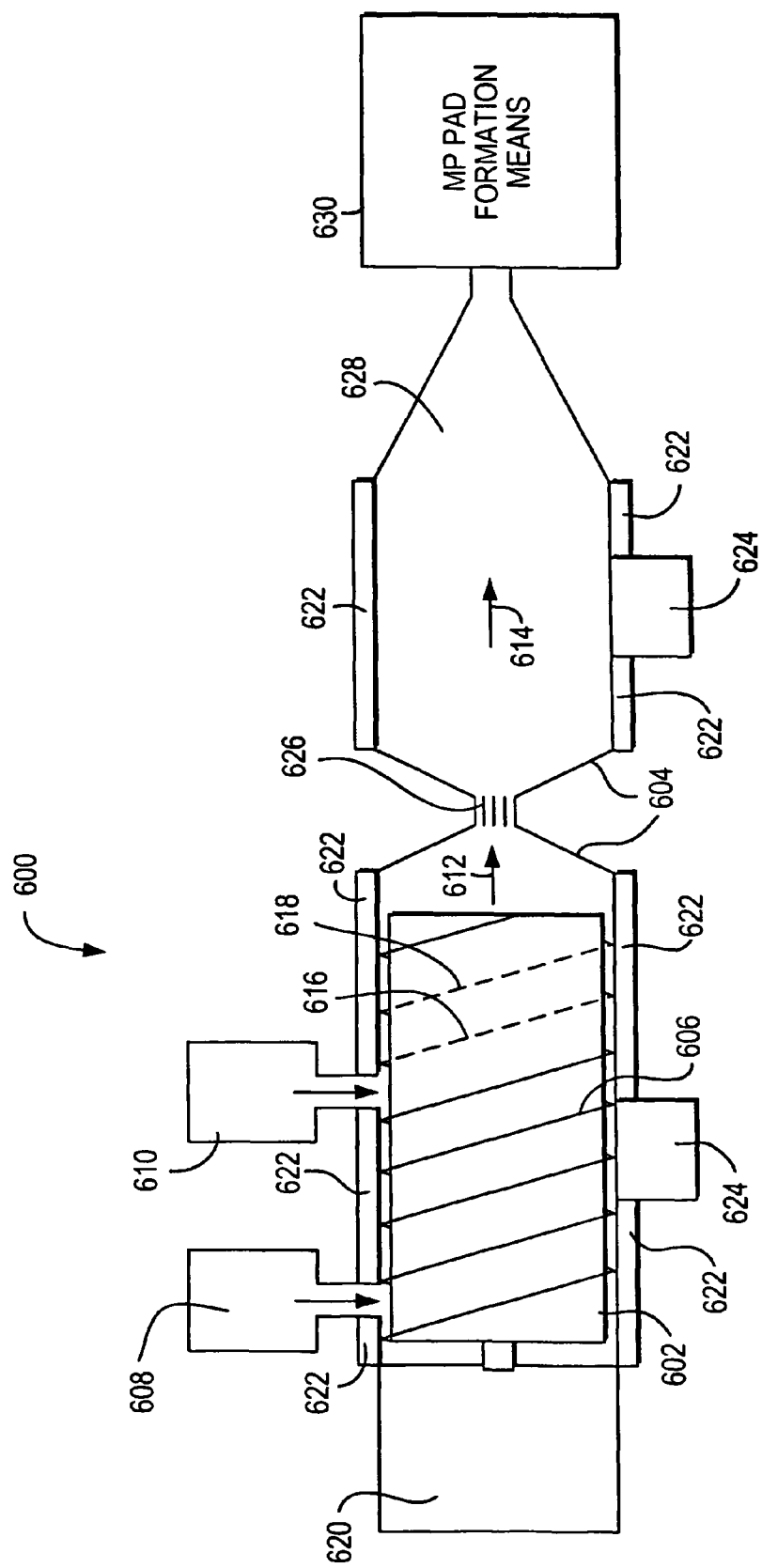
FIG. 6 is a cross-sectional diagram of an exemplary extrusion system for producing foamed thermoplastic polymeric MP pads according to the invention.

FIG. 6 shows an exemplary extrusion system 600 for producing foamed thermoplastic polymeric MP pads in accordance with the invention. In extrusion system 600, extrusion screw 602 is positioned inside a first region of extruder casing 604. Extrusion screw 602 has a plurality of screw flights 606 that facilitate downstream movement of thermoplastic polymer and foaming agent injected into extruder casing 604 by thermoplastic polymer source 608 and foaming agent source 610. Downstream movement is in the direction indicated by arrows 612 and 614. As shown, some screw flights 606 are discontinuous (i.e., contain open spaces). Discontinuous screw flights 616 and 618 facilitate mixing of the thermoplastic polymer and foaming agent. In particular, discontinuous screw flights 616 and 618 facilitate formation of a single-phase solution of the thermoplastic polymer and supercritical fluid foaming agent. Drive motor 620 rotates extrusion screw 602 during the extrusion process.

Temperature control units 622 are positioned along the exterior of extruder casing 604 and control the extrusion process temperature. Because the solubility of a supercritical fluid foaming agent is inversely proportional to the process temperature, and because a molten thermoplastic polymer more readily dissolves the foaming agent than does a solid thermoplastic polymer, temperature control units 622 preferably maintain process temperature slightly above the melting point of the thermoplastic polymer during formation of a single-phase solution of a thermoplastic polymer and supercritical fluid. Temperature control units 622 may extend along the entire exterior of extruder casing 604 or may be selectively positioned along the exterior of extruder casing 604. Individual temperature control units 622 may maintain a common process temperature in all regions of extruder casing 604, or may maintain different process temperatures in different regions of extruder casing 604. For example, because a rapid increase in temperature can result in nucleation of a single-phase solution of a thermoplastic polymer and supercritical fluid foaming agent, temperature control units 622 may maintain a differential temperature between adjacent regions of external casing 604 to induce nucleation as the single-phase solution passes from one region of external casing 604 to an adjacent region.

Pressure control units 624 are positioned along the exterior of extruder casing 604 and control the extrusion process pressure. Because the solubility of a supercritical fluid foaming agent is directly proportional to the process pressure, and because a supercritical fluid foaming agent is more soluble in a thermoplastic polymer than is a liquid or gaseous foaming agent, pressure control units 624 preferably maintain process pressure above the critical pressure of the supercritical fluid foaming agent during formation of a single-phase solution of a thermoplastic polymer and supercritical fluid foaming agent. Pressure control units 624 may extend along the entire exterior of extruder casing 604 or may be selectively positioned along the exterior of extruder casing 604. Individual pressure control units 624 may maintain a common process pressure in all regions of extruder casing 604, or may maintain different process pressures in different regions of extruder casing 604. For example, because a rapid drop in pressure can result in nucleation of a single-phase solution of a thermoplastic polymer and supercritical fluid foaming agent, pressure control units 624 may maintain a differential pressure between adjacent regions of external casing 604 to induce nucleation as the single-phase solution passes from one region of external casing 604 to an adjacent region.

Nucleator 626 is positioned in a second region of extruder casing 604. Nucleator 626 is a collection of restrictive pathways through which the single-phase solution formed in the first region of casing 604 experiences a pressure drop that induces homogeneous nucleation of the single-phase solution. Particularly, as the single-phase solution of a thermoplastic polymer and supercritical fluid foaming agent passes through the restrictive pathways of nucleator 626, a rapid pressure drop causes a decrease in solubility of the supercritical fluid foaming agent in the thermoplastic polymer. Uniformly sized and evenly dispersed clusters of foaming agent molecules form in the thermoplastic polymer, thus homogeneously nucleating the thermoplastic polymer. In some embodiments, nucleator 626 is a temperature control unit that induces a rapid temperature increase in the single-phase solution formed in the first region of extruder casing 604. In such extrusion systems, the rapid temperature increase induces nucleation of the single-phase solution of a thermoplastic polymer and supercritical fluid foaming agent.

A third region of extruder casing 604 forms chamber 628, which is immediately downstream of nucleator 626. Chamber 628 receives nucleated thermoplastic polymer from nucleator 626. The temperature control units 622 and the pressure control unit 624 positioned along the exterior of the third region of extruder casing 604 control the temperature and pressure, respectively, in chamber 628. In particular, temperature control units 622 and pressure control unit 624 positioned along the exterior of chamber 628 control cell growth in the nucleated thermoplastic polymer passed from nucleator 626 into chamber 628. Because a pressure drop can induce cell growth in a nucleated thermoplastic polymer, the pressure control unit 624 that controls process pressure in chamber 628 may optionally maintain pressure in chamber 628 significantly lower than the process pressure upstream of nucleator 626 (e.g., no less than 1000 psi lower). Because a temperature increase can induce cell growth in the nucleated thermoplastic polymer, the temperature control units 622 that control process temperature in chamber 628 may optionally maintain temperature in chamber 628 significantly higher than the process temperature upstream of nucleator 626 to promote cell growth in the thermoplastic polymer.

Downstream from chamber 628, foamed thermoplastic polymer is extruded from extrusion system 600 to MP pad formation means 630. In some embodiments, MP pad formation means is an MP pad mold. The foamed thermoplastic polymer in the MP pad mold can be exposed to temperatures and pressures that control continued cell growth in the foamed thermoplastic polymer. Alternatively, the foamed thermoplastic polymer in the MP pad mold can be exposed to ambient conditions, which will cause cell growth in the foamed thermoplastic polymer to gradually stop.

In other embodiments, MP pad formation means 630 is a machine (e.g., a blow molding machine) for forming the foamed thermoplastic polymer into a sheet from which individual MP polishing pads are mechanically skived. However, because mechanical skiving can cause MP pad defects, as previously described, it is generally less desirable to form a sheet of foamed thermoplastic material from which individual MP pads are mechanically skived.

In alternative embodiments in accordance with the invention, chamber 628 can be excluded from extrusion system 600. Foamed thermoplastic material is instead extruded directly from nucleator 626 to MP pad formation means 630. For example, the foamed thermoplastic material can be extruded directly from nucleator 626 into an MP pad mold. The MP pad mold can be maintained at ambient pressure and temperature, or alternatively at pressures and temperatures that control cell growth in the thermoplastic polymer. Also, foamed thermoplastic polymer may be extruded directly from nucleator 626 and formed into a sheet (e.g., extruding directly into sheet form or using a blow molding machine) from which individual MP pads are mechanically cut.

Thus it is seen that known methods of fabricating foamed thermoplastic polymers using supercritical fluids can be used to fabricate foamed thermoplastic polymeric MP pads. One skilled in the art will appreciate that the invention can be practiced by other than the described embodiments, which are presented for purposes of illustration and not of limitation, and the invention is limited only by the claims which follow.

I claim:

1. Apparatus for fabricating foamed thermoplastic polymeric mechanical planarization polishing pads using supercritical fluid, the apparatus comprising:
    a mechanical planarization polishing pad mold;
    an extrusion system used for molding a solid thermoplastic polymer in a mechanical planarization polishing pad mold to form an unfoamed thermoplastic polymeric pad;
    an extrusion screw used for impregnating said unfoamed thermoplastic polymeric pad with a supercritical fluid foaming agent;
    a plurality of discontinuous screw flights of said extrusion screw for mixing said unfoamed thermoplastic polymeric pad with said supercritical fluid foaming agent to achieve a desired cell density of a foamed thermoplastic polymeric mechanical planarization polishing pad;
    a foaming chamber;
    a nucleator comprising a plurality of restrictive pathways positioned between the extrusion screw and the foaming chamber; and
    a temperature control unit and a pressure control unit, positioned on the exterior of said foaming chamber, used for foaming said unfoamed thermoplastic polymeric pad to produce said foamed thermoplastic polymeric mechanical planarization polishing pad, wherein in response to said desired cell density, said temperature control unit and said pressure control unit are set to:
    a process temperature;
    a process pressure;
    a rate of temperature increase; and
    a pressure drop rate.

2. Apparatus for fabricating foamed thermoplastic polymeric mechanical planarization polishing pads using supercritical fluid, the apparatus comprising:
    a mechanical planarization polishing pad mold;
    an extrusion system used for molding a solid thermoplastic polymer in a mechanical planarization polishing pad mold to form an unfoamed thermoplastic polymeric pad;
    an extrusion screw used for impregnating said unfoamed thermoplastic polymeric pad with a supercritical fluid foaming agent; and
    a plurality of discontinuous screw flights of said extrusion screw for mixing said unfoamed thermoplastic polymeric pad with said supercritical fluid foaming agent to achieve a desired cell density of a foamed thermoplastic polymeric mechanical planarization polishing pad;
    a foaming chamber;
    a nucleator comprising a plurality of restrictive pathways positioned between the extrusion screw and the foaming chamber; and
    a temperature control unit and a pressure control unit, positioned on the exterior of said foaming chamber, used for foaming said unfoamed thermoplastic polymeric pad to produce a foamed thermoplastic polymeric mechanical planarization polishing pad by decreasing process pressure and increasing process temperature of said supercritical fluid foaming agent, wherein in response to said desired cell density, said temperature control unit and said pressure control unit are set to:
a process temperature;
a process pressure;
a rate of temperature increase; and
a pressure drop rate.

3. The apparatus of claim 1 wherein said solid thermoplastic polymer is selected from the group consisting of thermoplastic elastomer, thermoplastic butadiene styrene, thermoplastic polyvinylidene difluorine, high-impact polystyrene, and any combination thereof.

4. The apparatus of claim 1 wherein said supercritical fluid foaming agent is selected from the group consisting of supercritical fluid carbon dioxide and supercritical fluid nitrogen.

5. The apparatus of claim 1 wherein said extrusion screw used for impregnating said unfoamed thermoplastic polymeric pad is configured to impregnate said unfoamed thermoplastic polymeric pad with a supercritical fluid foaming agent at a process pressure that exceeds a critical pressure of said supercritical fluid foaming agent.

6. The apparatus of claim 1 wherein said extrusion screw used for impregnating said unfoamed thermoplastic polymeric pad is configured to impregnate said unfoamed thermoplastic polymeric pad with a supercritical fluid foaming agent at a process temperature that exceeds a critical temperature of said supercritical fluid foaming agent.

7. The apparatus of claim 1 wherein said extrusion screw used for impregnating said unfoamed thermoplastic polymeric pad is configured to:
place said unfoamed thermoplastic polymeric pad in a pressurized chamber wherein process pressure in said pressurized chamber exceeds a critical pressure of said supercritical fluid foaming agent and process temperature in said pressurized chamber exceeds a critical temperature of said supercritical fluid foaming agent; and
bathe said unfoamed thermoplastic polymeric pad in said supercritical fluid foaming agent while said unfoamed thermoplastic polymeric pad is in said pressurized chamber.

8. The apparatus of claim 1 wherein said temperature control unit and said pressure control unit used for foaming said unfoamed thermoplastic polymeric pad are configured to:
decrease the solubility of said supercritical fluid foaming agent in said unfoamed thermoplastic polymeric pad; and
increase the volume of said supercritical fluid foaming agent in said unfoamed thermoplastic polymeric pad.

9. The apparatus of claim 8 wherein said pressure control unit is further configured to decrease process pressure of said supercritical fluid foaming agent in said unfoamed thermoplastic polymeric pad.

10. The apparatus of claim 8 wherein said temperature control unit is further configured to increase process temperature of said supercritical fluid foaming agent in said unfoamed thermoplastic polymeric pad.

11. The apparatus of claim 8 wherein said temperature control unit and said pressure control unit are further configured to:
decrease process pressure of said supercritical fluid foaming agent in said solid thermoplastic polymer; and
increase process temperature of said supercritical fluid foaming agent in said unfoamed thermoplastic polymeric pad.

12. The apparatus of claim 8 wherein said pressure control unit is further configured to decrease process pressure of said supercritical fluid foaming agent in said unfoamed thermoplastic polymeric pad.

13. The apparatus of claim 8 wherein said temperature control unit is further configured to increase process temperature of said supercritical fluid foaming agent in said unfoamed thermoplastic polymeric pad.

14. The apparatus of claim 8 wherein said temperature control unit and said pressure control unit are further configured to:
decrease process pressure of said supercritical fluid foaming agent in said unfoamed thermoplastic polymeric pad; and
increase process temperature of said supercritical fluid foaming agent in said unfoamed thermoplastic polymeric pad.

15. The apparatus of claim 1 wherein said pressure control unit is configured to decrease process pressure of said supercritical fluid foaming agent in said unfoamed thermoplastic polymeric pad.

16. The apparatus of claim 1 wherein said temperature control unit is configured to increase process temperature of said supercritical fluid foaming agent in said unfoamed thermoplastic polymeric pad.

17. The apparatus of claim 1 wherein said temperature control unit and said pressure control unit are configured to:
decrease process pressure of said supercritical fluid foaming agent in said unfoamed thermoplastic polymeric pad; and
increase process temperature of said supercritical fluid foaming agent in said unfoamed thermoplastic polymeric pad.

18. The apparatus of claim 1 wherein said temperature control unit and said pressure control unit used for foaming said unfoamed thermoplastic polymeric pad are configured to foam said unfoamed thermoplastic polymeric pad to produce an open-celled foamed thermoplastic polymeric mechanical planarization polishing pad.

19. The apparatus of claim 1 wherein said temperature control unit and said pressure control unit used for foaming said unfoamed thermoplastic polymeric pad are configured to foam said unfoamed thermoplastic polymeric pad to produce an closed-celled foamed thermoplastic polymeric mechanical planarization polishing pad.

20. An apparatus for fabricating foamed thermoplastic polymeric mechanical planarization polishing pads, comprising:
an extruder casing;
an extrusion screw positioned within a first region of the extruder casing, the extrusion screw comprising a plurality of unidirectional screw flights at least some of which are discontinuous screw flights;
one or more temperature control units positioned along the exterior of the extruder casing;
one or more pressure control units positioned along the exterior of the extruder casing;
a nucleator comprising a plurality of restrictive pathways positioned within a second region of the extruder casing; and
a mechanical planarization polishing pad formation device selected from the group consisting of a mechanical planarization polishing pad mold and a blow molding machine.

21. The apparatus of claim 20 wherein the mechanical planarization polishing pad formation device is immediately downstream from the nucleator.

22. The apparatus of claim 20 further comprising a foaming chamber within a third region of the casing positioned between the nucleator and the mechanical planarization polishing pad formation device.

23. The apparatus of claim 20 wherein a single-phase solution formed in the first region of the casing undergoes a pressure drop that induces homogenous nucleation as it passes though the nucleator.

24. The apparatus of claim 20 wherein a single-phase solution formed in the first region of the casing undergoes a temperature increase that induces homogenous nucleation as it passes though the nucleator.

25. The apparatus of claim 20 wherein the one or more temperature control units are configured to maintain a temperature differential between adjacent regions of the extruder casing.

26. The apparatus of claim 20 wherein the one or more temperature control units are configured to maintain a common process temperature in all regions of the extruder casing.

27. The apparatus of claim 20 wherein the one or more temperature control units extend along the entire exterior of the extruder casing.

28. The apparatus of claim 20 wherein the one or more pressure control units extend along the entire exterior of the extruder casing.

29. The apparatus of claim 20 wherein the one or more pressure control units are configured to maintain different process pressures in different regions of the extruder casing.

* * * * *

UNITED STATES PATENT AND TRADEMARK OFFICE
CERTIFICATE OF CORRECTION

PATENT NO. : 7,862,316 B2  
APPLICATION NO. : 11/650047  
DATED : January 4, 2011  
INVENTOR(S) : Stephen J. Kramer Page 1 of 1

It is certified that error appears in the above-identified patent and that said Letters Patent is hereby corrected as shown below:

In column 15, line 8, in Claim 23, delete "though" and insert -- through --, therefor.

In column 15, line 12, in Claim 24, delete "though" and insert -- through --, therefor.

Signed and Sealed this
Eighth Day of March, 2011

David J. Kappos
*Director of the United States Patent and Trademark Office*